United States Patent [19]

Bacchi et al.

[11] Patent Number: 5,538,385
[45] Date of Patent: Jul. 23, 1996

[54] SPECIMEN CARRIER HOLDER AND METHOD OF OPERATING IT

[75] Inventors: Paul E. Bacchi, Novato; Manuel J. Robalino, San Francisco, both of Calif.

[73] Assignee: Kensington Laboratories, Inc., Richmond, Calif.

[21] Appl. No.: 265,667

[22] Filed: Jun. 24, 1994

[51] Int. Cl.[6] ................................................. B65G 49/07
[52] U.S. Cl. ........................... 414/403; 414/331; 414/416; 414/940
[58] Field of Search .................... 414/217, 331, 414/403–4, 416, 940, 937, 938

[56] References Cited

U.S. PATENT DOCUMENTS

| | | | |
|---|---|---|---|
| 4,597,708 | 7/1986 | Wheeler et al. | 414/331 |
| 4,636,128 | 1/1987 | Millis et al. | 414/403 X |
| 4,643,629 | 2/1987 | Takahashi et al. | 414/331 |
| 4,768,640 | 9/1988 | Sticht | 198/396 |
| 4,776,744 | 10/1988 | Stonestreet et al. | 414/217 |
| 4,786,816 | 11/1988 | Ohmori et al. | 250/561 |
| 4,790,709 | 12/1988 | Sakimori et al. | 414/416 |
| 4,803,373 | 2/1989 | Imamura et al. | 250/561 |
| 4,859,137 | 8/1989 | Bonora et al. | 414/940 X |
| 4,875,825 | 10/1989 | Tullis et al. | 414/217 X |
| 4,895,486 | 1/1990 | Baker et al. | 414/331 |
| 5,003,188 | 3/1991 | Igari | 250/561 |
| 5,110,248 | 5/1992 | Asano et al. | 414/416 X |
| 5,181,819 | 1/1993 | Sakata et al. | 414/217 |
| 5,186,594 | 2/1993 | Toshima et al. | 414/217 |
| 5,219,464 | 6/1993 | Yamaga et al. | 414/416 X |
| 5,382,806 | 1/1995 | Bacchi et al. | 414/940 X |

FOREIGN PATENT DOCUMENTS

| | | | |
|---|---|---|---|
| 63-72137 | 4/1988 | Japan . | |
| 2178948 | 7/1990 | Japan | 414/940 |
| 4189483 | 7/1992 | Japan | 414/940 |
| 5090384 | 4/1993 | Japan | 414/940 |

OTHER PUBLICATIONS

IBM Technical Disclosure Bulletin, vol. 31 No. 10, Mar. 1989 Dual Microscope Semiconductor Wafer Inspection Machine.

*Primary Examiner*—James W. Keenan
*Attorney, Agent, or Firm*—Stoel Rives

[57] ABSTRACT

A tiltable specimen holder (48) in an apparatus (46) for performing an automated operation on a selected one of multiple specimens (12) contained in a specimen carrier (10) has a receiving member (60) that, when oriented in a load position (48C; FIG. 10), receives the carrier from, or presents the carrier to, the hand (108) of a human being (110) without substantial flexure of the human being's wrists (112). The holder also has a bottom member (62) that cooperates with the receiving member and a support member (32, 34) of the carrier to place and hold the carrier in a predetermined alignment relative to the receiving member. The receiving member has beveled edges (84, 86, 88) that cooperate with a guide member (28, 30) of the carrier to guide the carrier to self-align into grooves (90, 92) defined by the beveled edges. Rollers (94) in the grooves cooperate with the guide members to guide the carrier to the predetermined alignment. The holder with the carrier installed is tilted among the load position, a hold position, and an operating position (48A, 48B; FIGS. 6A–9). The holder is also useful in applications that use automated machinery to load the carrier into, or to remove it from, the holder.

12 Claims, 10 Drawing Sheets

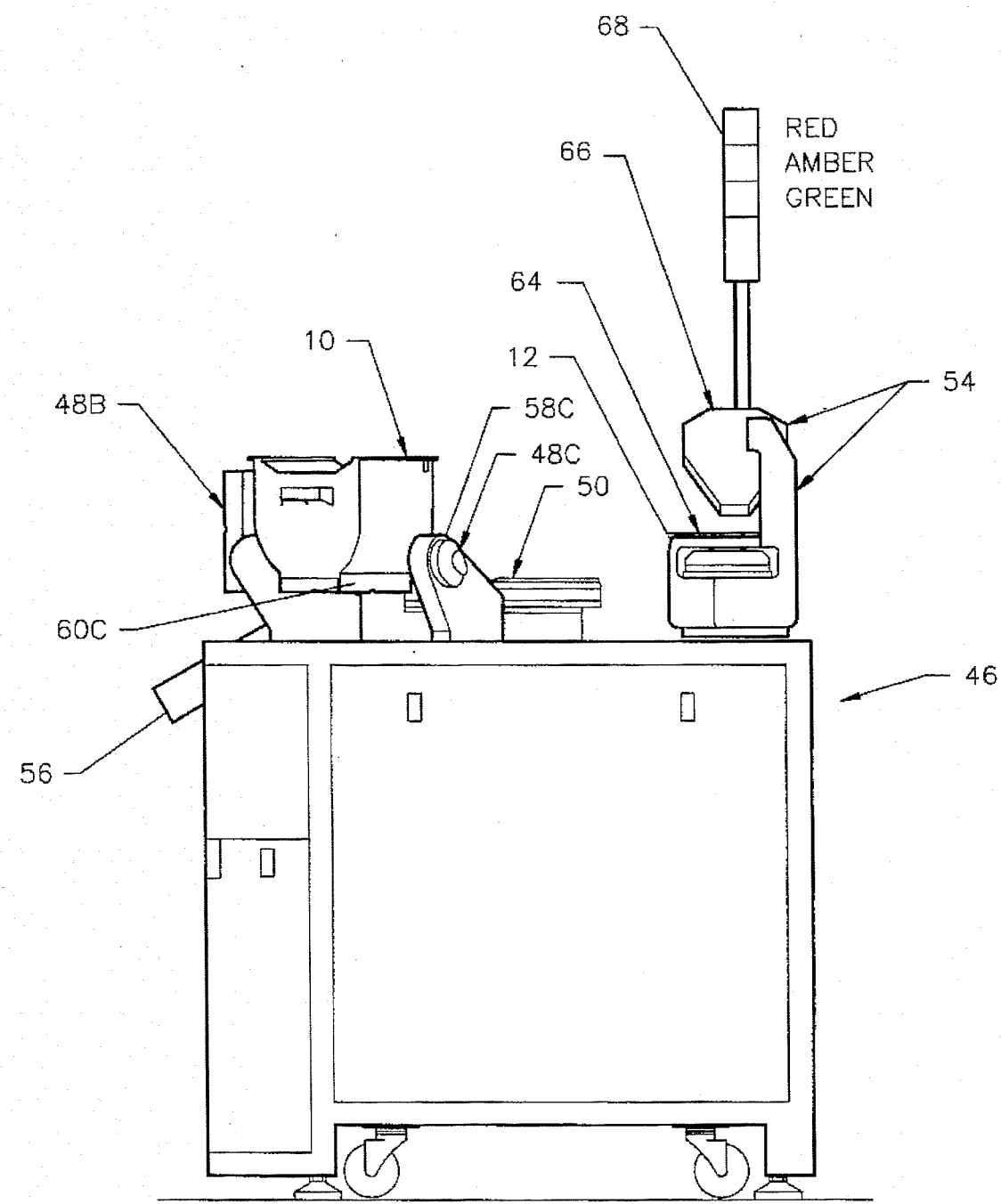

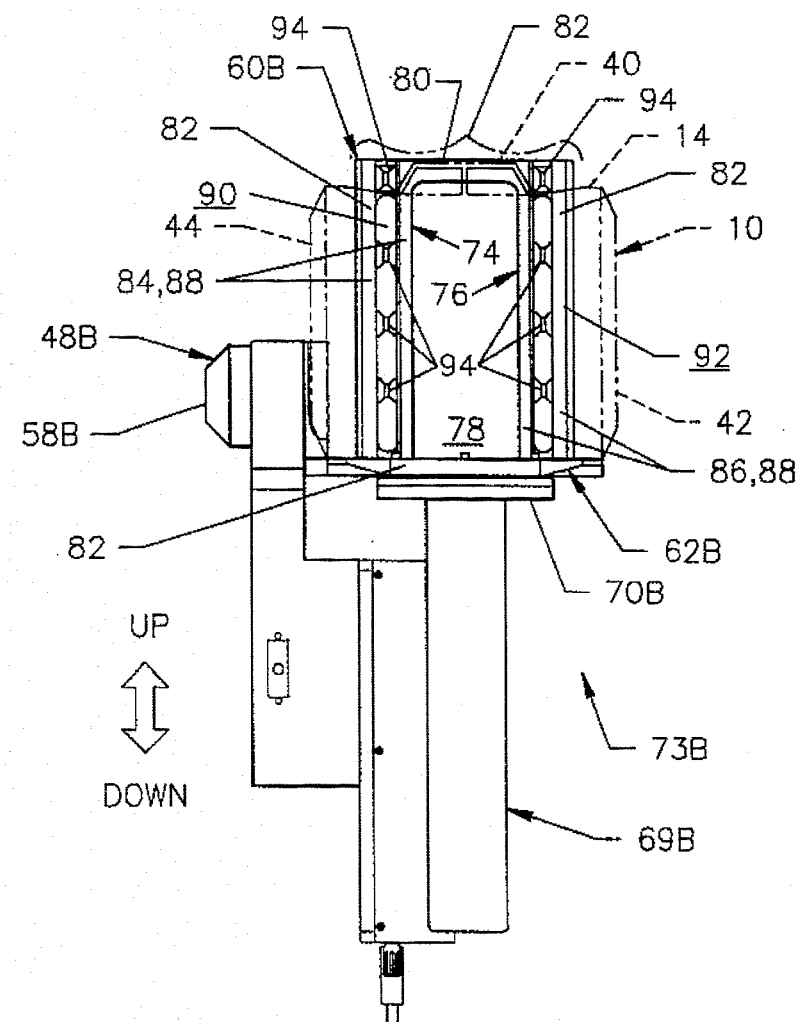
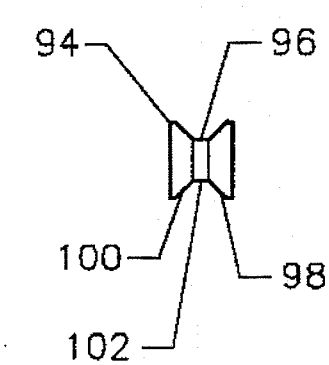
FIG. 6A
FIG. 6B 5,538,385

SPECIMEN CARRIER HOLDER AND METHOD OF OPERATING IT

TECHNICAL FIELD

The present invention pertains to systems for performing an automated operation on a selected one of multiple specimens contained in a specimen carrier and, in particular, to a device for and method of orienting a specimen carrier on such a system before, during, and after an operation on the specimens.

BACKGROUND OF THE INVENTION

Fabrication plants that manufacture semiconductor electronic components from semiconductor wafers typically include a wide variety of process stations at which wafers in different stages of manufacturing undergo process steps, are evaluated for the possible presence of defects, or are catalogued, sorted, or otherwise handled. To reduce the risk of contamination and breakage brought about by activity of human beings, the process stations typically are partly or wholly automated.

The wafers are typically moved from one station to another in a wafer carrier that a human being manually installs in and later removes from a process station. The wafer carrier is typically designed to allow automated removal of wafers from it and insertion of wafers into it and to allow contaminants present on or around wafers in it to drop away from it. A handle is usually placed at the top of the carrier so that a human being can conveniently hold it with one hand while walking between process stations.

Because of the high throughput of contemporary fabrication plants, employees who load wafer carriers into, remove them from, and move them among process stations may handle loaded carriers hundreds of times each day. Those employees have loaded the carriers into, or removed them from, process stations by holding the top handle in one hand and flexing the wrist to which that hand is connected to load the carrier into, or to remove it from, an operating position in which the carrier is oriented for presentation of the wafers to the apparatus. A fully loaded wafer carrier may weigh as much as 4 kilograms (about 9 pounds). The weight of the carrier when it holds a substantial fraction of its capacity of wafers places substantial stress on the flexed wrist; that stress is believed to be a substantial cause of an unusually high rate of so-called "repetitive strain injuries" or "cumulative trauma" such as carpal tunnel injury, a painful and potentially disabling condition, among those workers. There is a need to reduce the incidence of such injuries.

SUMMARY OF THE INVENTION

One object of the invention is to provide in a process station a wafer carriers holder into which one or more fully loaded wafer carriers may be loaded, and from which one or more fully loaded wafer carriers may be removed, either by a human being with much less risk of repetitive stress injuries than is associated with performing those steps in prior art process stations, or by automated machinery.

Another object of the invention is to provide in a process station a wafer carriers holder that meets the preceding object with commonly used, prior art wafer carriers.

A further object of the invention is to provide a method by which a fully loaded wafer carriers may be loaded into, or removed from, a holder in a process station either by a human being with much less risk of repetitive stress injuries than is associated with prior art ways of performing those acts, or by automated machinery.

One aspect of the invention provides, in an apparatus for performing an automated operation on a selected one of multiple specimens contained in a specimen carriers, a tiltable specimen carriers holder into which a human being can manually load, and from which the human being can manually remove, a fully loaded specimen carriers with the reduced risk of repetitive stress injuries. The tiltable carriers holder has a receiving member that cooperates with part of the carriers (a guide member) to place and hold the carriers by gravity in a predetermined alignment relative to the receiving member. The apparatus also has a bottom member that cooperates with the receiving member to secure the carriers in the alignment. In a preferred embodiment, the receiving and bottom members are joined to form a rigid right angle structure, and a pivot pivotally connects the receiving member to the apparatus so that the receiving member and the bottom member can pivot between a load position and an operating position. In the load position the receiving member is oriented to allow convenient manual insertion and removal of the carriers without substantial flexure of either of the human being's wrists. In the operating position the bottom member is oriented to support the carriers and to orient it so that the apparatus can perform the operations on the selected specimen.

Another aspect of the invention provides a method of loading the carriers in an operating position in the apparatus. A tiltable carriers holder is provided, having a receiving member and a bottom member. The receiving member is equipped with a guide. The carriers is loaded into the carriers holder by placing in the guide a guide member formed on a back of the carriers. During this action, the holder is oriented in a load position in which a front opening of the carriers faces generally upward and a back opening of the carriers faces generally downward. The carriers is then tilted so that it is supported by its base on the bottom member in an operating position with the front opening oriented for presentation of the specimens to the apparatus.

The apparatus and the method of the invention can use prior art wafer carriers of the type described above and in connection with FIGS. 1–3. The apparatus and method allow workers manually to load such carriers into, or to remove such carriers from, the apparatus by using two hands to hold a respective one of two sides of the carriers without substantial flexure of either of the wrists. This greatly reduces the risk of repetitive stress injuries.

The apparatus and the method are also useful where automated machinery places the carriers into, or removes it from, the holder.

Additional objects and advantages of the present invention will be apparent from the detailed description of preferred embodiments thereof, which proceeds with reference to the accompanying drawings.

BRIEF DESCRIPTION OF THE DRAWINGS

FIG. 5 is a side elevational view of the station of FIG. 4.

FIG. 6A is an elevational view from the interior of the station of FIG. 4 of a holder assembly that includes the tiltable holder of FIG. 4 in an operating position.

FIG. 6B is a detailed view of one of the rollers shown in FIG. 6A

DETAILED DESCRIPTION OF A PREFERRED EMBODIMENT

Figure 1:
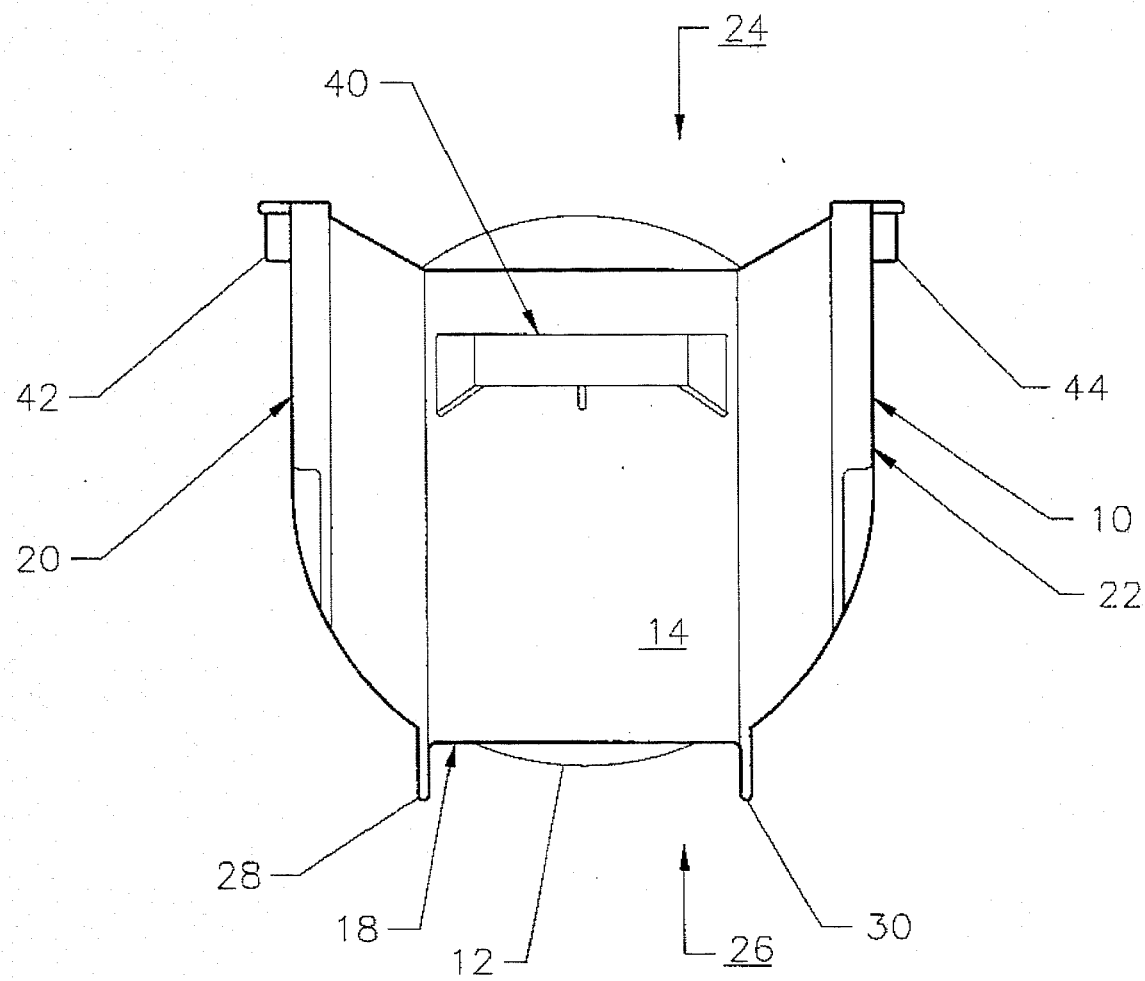
FIG. 1 is a top view of a prior art wafer carriers.
Figure 2:
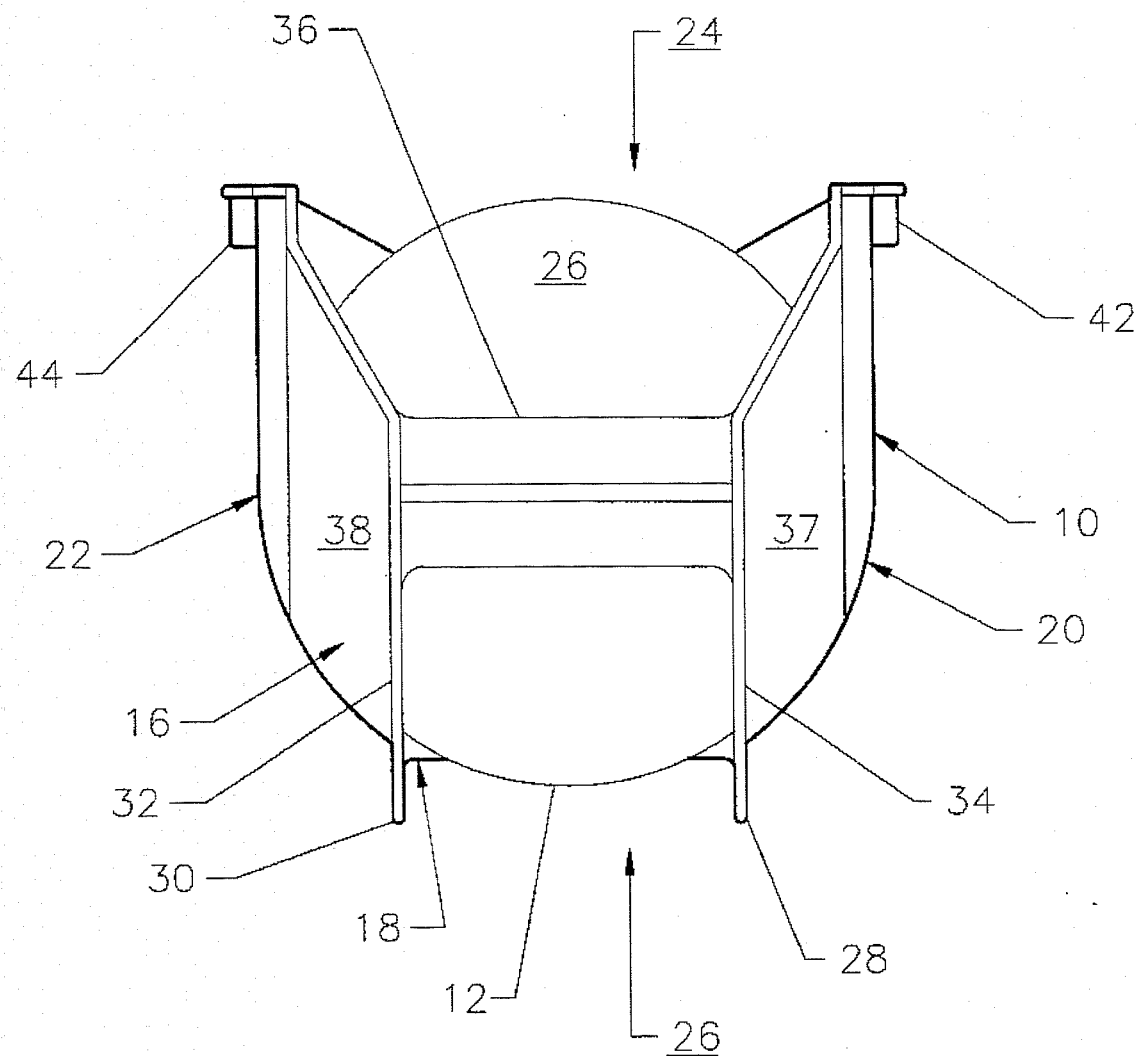
FIG. 2 is a bottom view of the carriers of FIG. 1.
Figure 3:
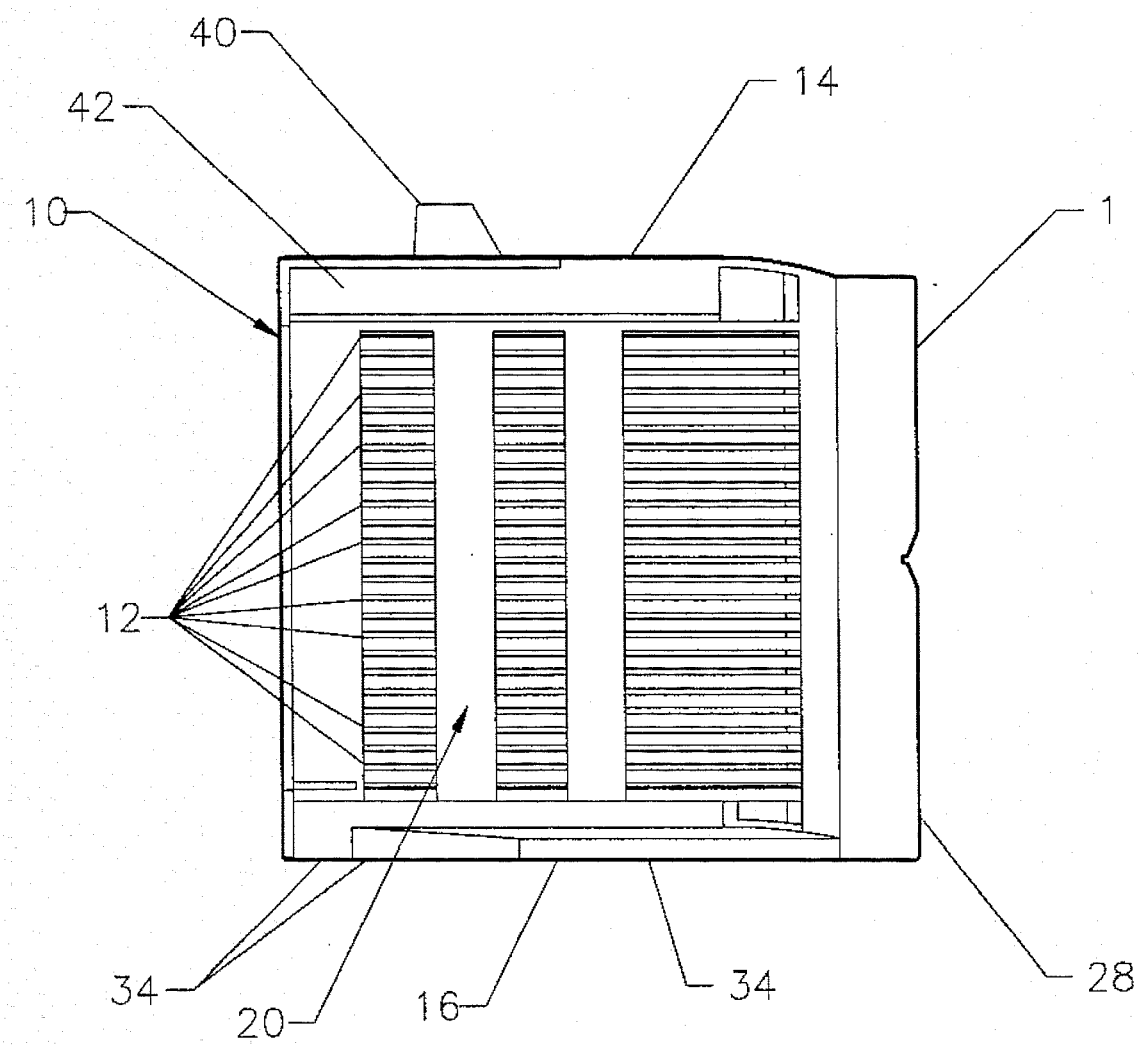
FIG. 3 is a side elevational view of the carriers of FIG. 1.

With reference to FIGS. 1–3, a prior art wafer carriers 10 (also called a specimen carriers or wafer cassette) is adapted to store one or more (typically as many as 25) generally planar wafers 12 (also called specimens or disks) in a stacked relationship. Wafers 12 are usually formed of a semiconductor material such as silicon or gallium arsenide. Wafer 12 may also contain a layer of a semiconductor material, e.g., one or more layers defining electronic circuits that are being or have been manufactured on the wafer. Carrier 10 has a top 14, a base 16, a back 18, and two opposing sides 20 and 22 connected to base 16 and back 18. Sides 20 and 22 define a front opening 24 and a rear opening 26. Sides 20 and 22 are formed so that they converge toward each other near rear opening 26 so that it is smaller than front opening 24. Front opening 24 is sized for insertion of wafers 12 into, and for removal of wafers 12 from, carriers 10. Back opening 26 is sized for retention of wafers 12 in carriers 10. Each of wafers 12 has a generally planar lower surface portion 27 that is adjacent front opening 24 when wafers 12 are positioned in carriers 10.

Carrier 10 stores wafers 12 essentially parallel to one another and in a generally horizontal orientation when carriers 10 is in an upright position as shown in FIG. 3. The interior surface (not shown) of each of sides 20 and 22 is provided with plural parallel spaced apart projections (not shown), which form parallel grooves (not shown). Each groove in the interior surface of side 20 is coplanar with a corresponding groove in the interior surface of side 22; each pair of coplanar grooves forms a slot 23 (FIG. 4) adapted to support a wafer 12. Conventionally, each slot is parallel to base 16.

Back 18 includes two spines or guide members 28 and 30 that project from back 18 to support carriers 10 when it is oriented so that front opening 24 is directed generally upward and back opening 26 is directed generally downward. Base 16 includes two support members 32 and 34 that project away from base 16 to support carriers 10 when it is oriented so that front opening 24 is directed generally horizontally. Support members 32 and 34 are linked through cross member 36 and through respective base areas 37 and 38 and their connection with respective sides 20 and 22 and top 14.

Top 14 is usually provided with a handle 40 by which carriers 10 is manually supported by one hand (not shown) of a human being in carrying carriers 10 and in the prior art method of loading carriers 10 into, or removing carriers 10 from, an apparatus for performing an operation on one or more wafers 12 contained in carriers 10.

Each of sides 20 and 22 is provided with a respective one of first and second flanges 42 and 44, which are located so that a respective one of the hands of a human being can grasp them for handling carriers 10.

Figure 4:
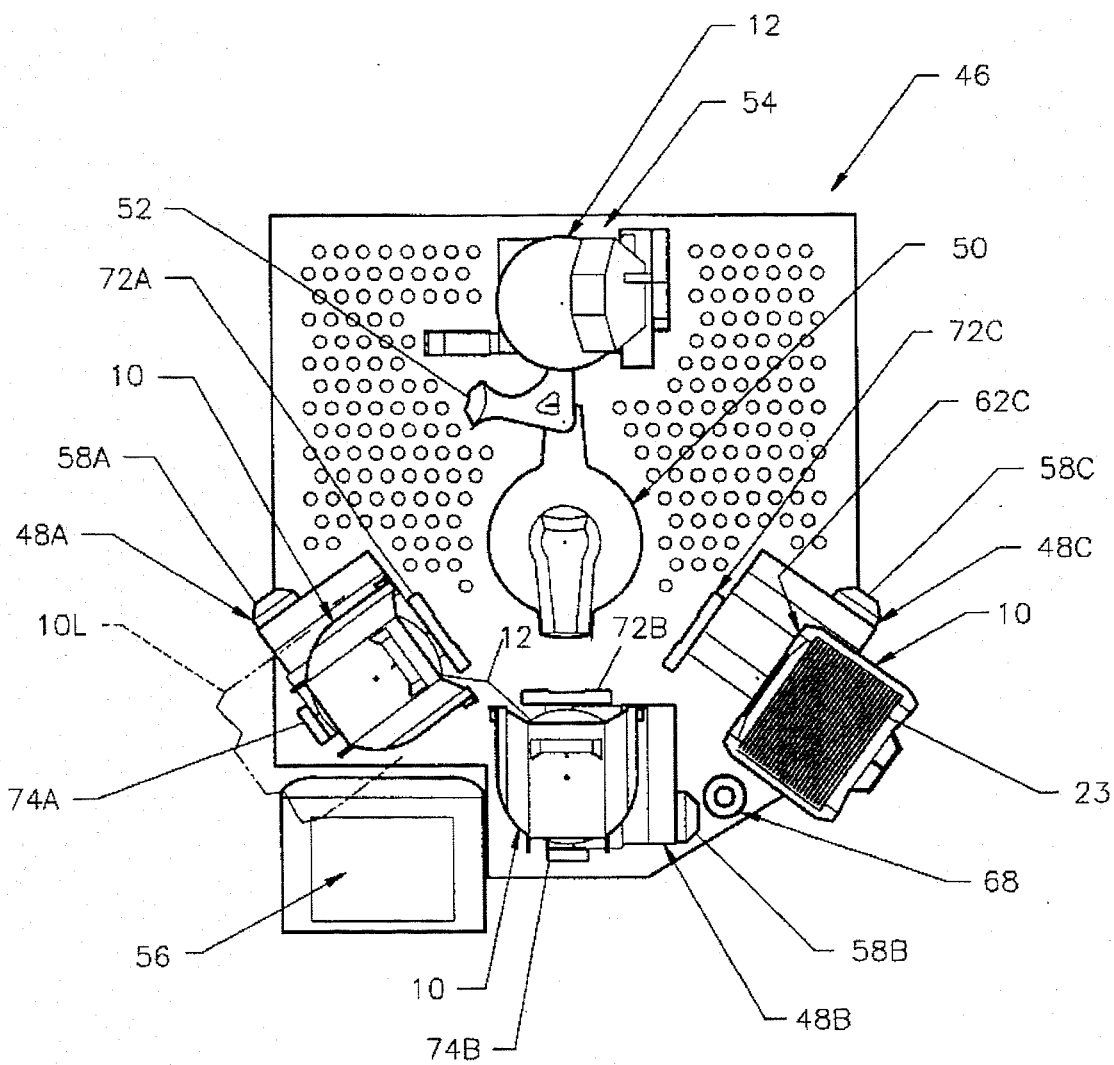
FIG. 4 is a top view of an automated wafer inspection station including a tiltable holder according to the invention.
Figure 7:
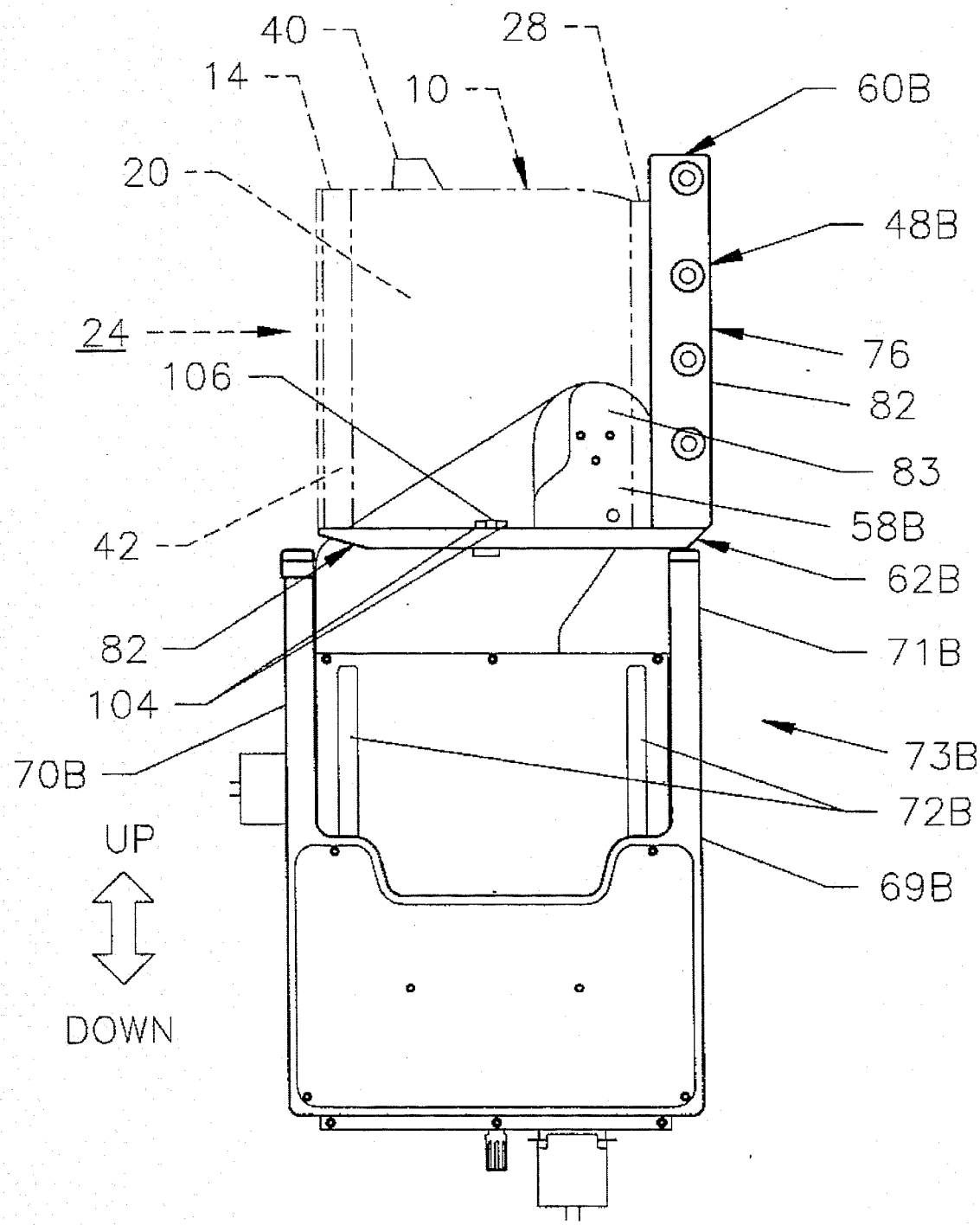
FIG. 7 is a side elevational view of the items shown in FIG. 6A in the operating position.
Figure 8:
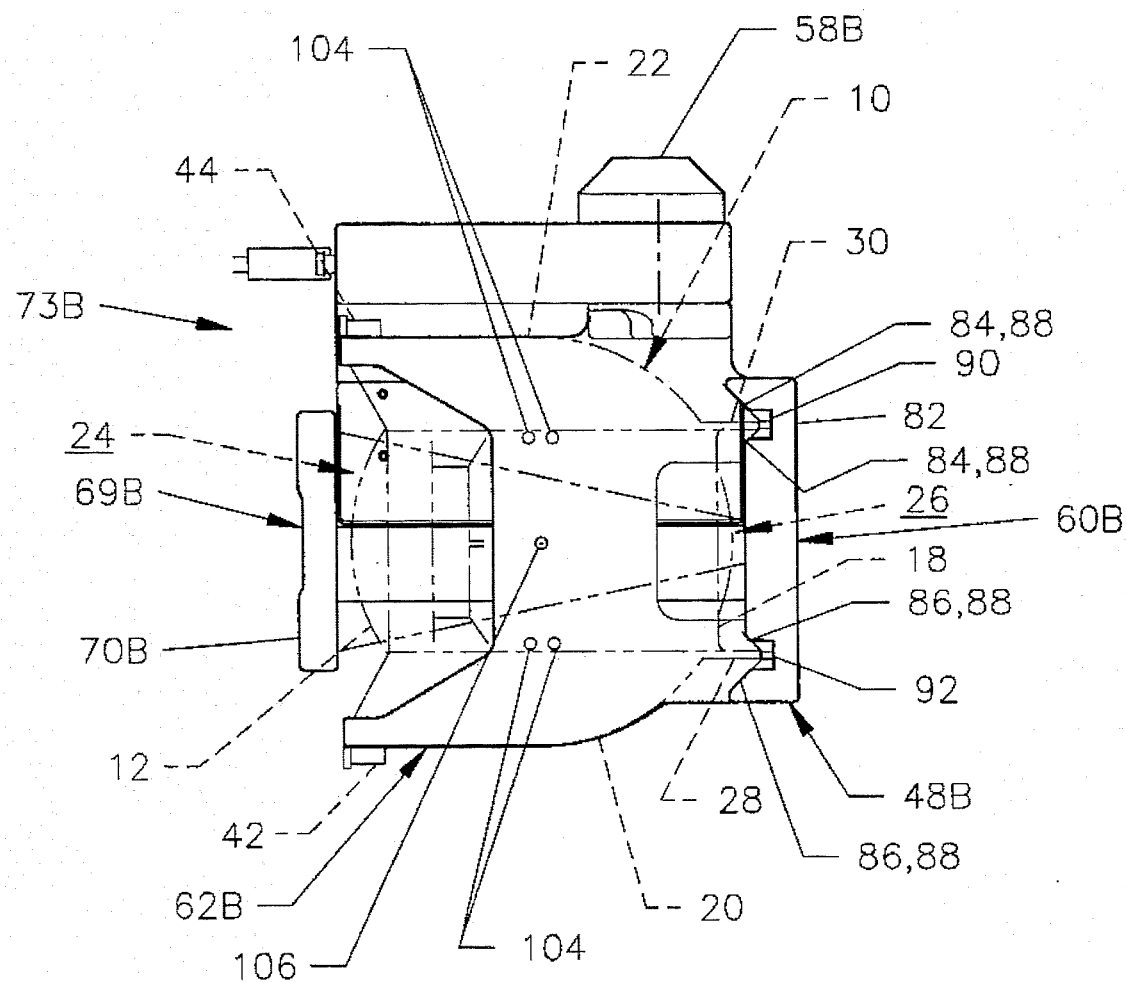
FIG. 8 is a top view of the items shown in FIG. 6A in the operating position.
Figure 9:
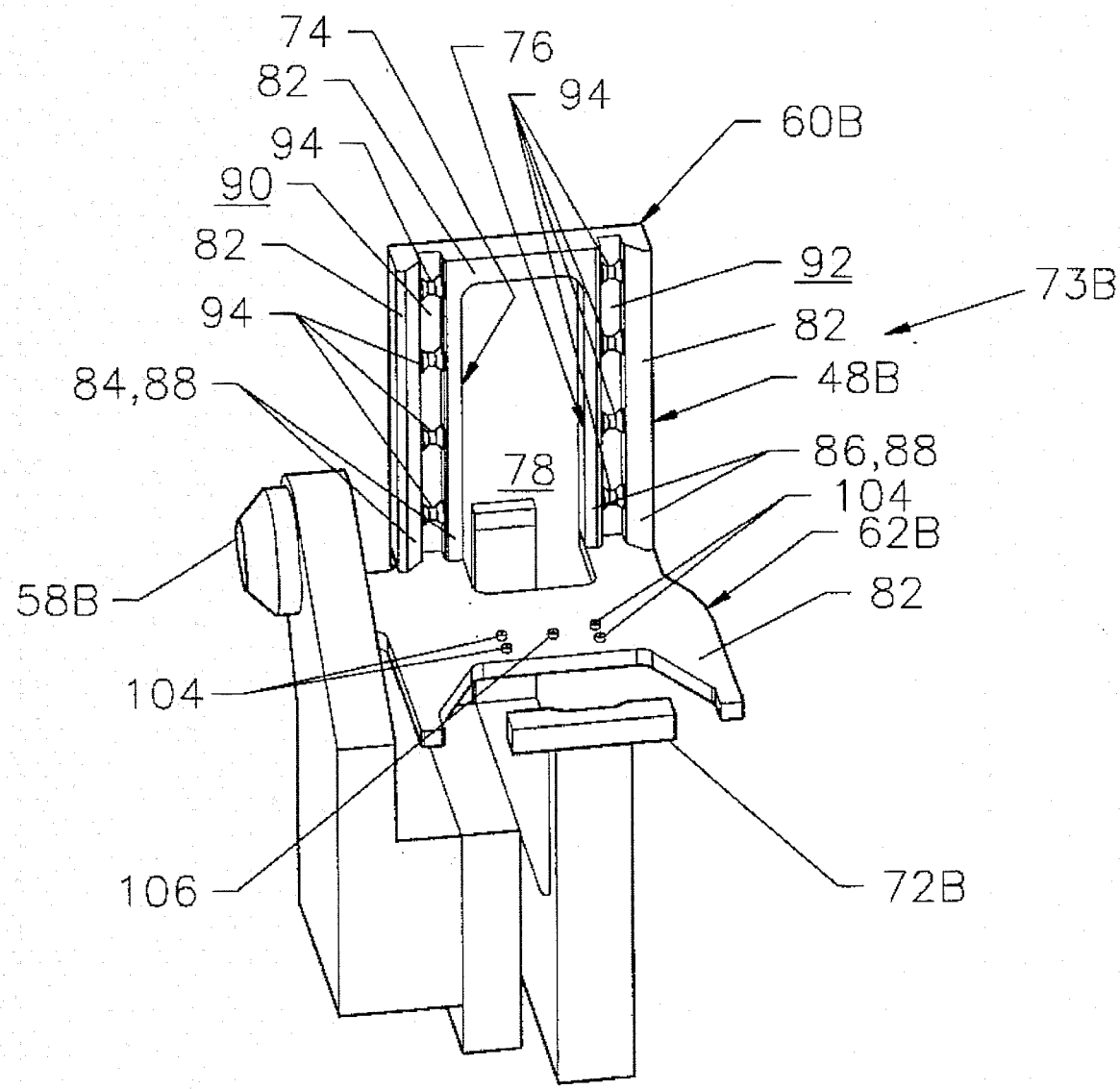
FIG. 9 is an isometric view of some of the items shown in FIG. 6A in the operating position.

FIGS. 4 and 5 are respective top and side elevational views of an apparatus or automated wafer identification station 46 for performing an operation on or inspecting one or more wafers 12 contained in carriers 10. Station 46 includes three tiltable carriers holders 48A, 48B, and 48C, each of which is shown holding a carriers 10. Carriers 10 in holders 48A and 48B are shown containing one or more wafers 12; carriers 10 in holder 48C is shown without wafers. Holders 48A and 48B are shown in an operating position in which inspection station 46 can inspect wafers 12 in carriers 10; holder 48C is shown in a load position. The location of carriers 10 when mounted in holder 48A in the load position is shown by phantom lines 10L.

A robotic transfer mechanism 50 positions a transfer arm 52 so that it selectively removes any one of wafers 12 from a carriers that is in the operating position, e.g., one of carriers 10 in holders 48A or 48B, and positions that wafer for identification by an optical character reader (OCR) 54, reverses that transfer, or transfers that wafer 12 to a carriers 10 other than the one from which it was taken. FIG. 4 shows transfer arm 52 holding one of wafers 12 near OCR 54; in FIG. 5 transfer arm 52 is in a different position and not shown. A preferred transfer mechanism 50 is a Kensington Laboratories, Inc., Model No. WH4, and a preferred OCR 54 is a Kensington Laboratories, Inc., OCR equipped with a Foresight™ illuminator.

Operations performed by station 46 are controlled by a servomechanism that receives commands delivered from an OS/2™-based computer having a touch-actuated actuated display 56. Touch-actuated display 56 selectively displays information about the status of station 46 and wafers 12.or accepts commands to the computer entered by manual actuation of the display.

Each of holders 48A–48C is selectively moveable under control of the computer to tilt or pivot between the load position, the operating position, and a hold position described below on a respective one of pivots 58A–58C located to allow such movement. Computer control of the pivotal movement of the holders promotes reliable, reproducible, controllable, and safe pivotal movement of the holders so that wafers 12 contained in them are not subjected to mechanical shock or even partial motion out of carriers 10. The pivot point placement represents a design compromise between compact installation for clearance in motion and ease of use. Positioning the pivot at or near the center of the carriers holder allows it to pivot within the volume of space it occupies. Positioning the pivot at the bottom or rear of the carriers holder facilitates convenient storage such as by mounting it in a recessed area of a wall and allowing the carriers to tilt outwardly to present its contents for processing.

In a preferred embodiment, holders 48A–48C are mounted for ease in manual loading and unloading of a carriers 10. Each of the pivots is attached to only one side of its respective holder, which leaves the other side of that holder free for manual loading of carriers 10 in, and removal of carriers 10 from, that holder. Pivots 58A–58C are further located in a position that is near the junction of respective receiving members 60A–C and bottom members 62A–C to allow for easy manual access on both sides of respective holders 48A–C to carriers 10 when those holders are in the load position. To further facilitate placement of carriers 10 in the holders, holder 48A has pivot 58A attached on its left-hand side, and holders 48B–48C 48C have a respective one of pivots 58–58C attached on their right-hand side.

When any one of holders 48A–48C is in the load position, carriers 10 aligned in them is supported by a respective one of receiving members 60–60C (only receiving member 60C shown) (FIG. 5). Receiving members 60–60C cooperate with guide members 28 and 30 (FIGS. 13) to place and hold one of carriers 10 in a predetermined alignment relative to the receiving member when holders 46A–46C are in the load position. One of bottom members 62A–62C (only bottom member 62C shown) (FIG. 4) cooperates with support members 32 and 34 of one of carriers 10 and with a respective one of receiving members 60–60C to secure carriers 10 in the predetermined alignment.

OCR 54 includes a prealigner stage 64 and an OCR illumination system 66. Station 46 also includes a status indicator 68 mounting red, amber, and green lights activated under control of the computer to display an indication of the status of the station.

One of automatic scanning or wafer location systems 69A–69C (also FIGS. 6A–10) is associated with a respective one of holders 48A–48C. Each of systems 69A–69C has a respective one of front and back inspection arms 70A–70C and 71A–71C continuously moveable in a respective pair of slots 72A–72C between a lowered position (FIGS. 4–10) and a raised position (not shown). As a respective pair of inspection arms 71A–71C and 72A–72C moves between the lowered and raised positions, optical inspection apparatus (not shown) contained in them passes front and back openings 24 and 26 of the carriers 10 mounted on a respective one of holders 48A–48C to determine the number and location of any wafers 12 present in that carriers. The operation of the inspection apparatus is described in U.S. patent application Ser. No. 07/972,183 of Bacchi et al. for a SPECIMEN CARRIER PLATFORM AND SCANNING ASSEMBLY, filed Nov. 4, 1992, assigned to the assignee of this application, and incorporated by reference herein.

FIGS. 6A, 6B, 7, 8, and 9 show a holder assembly 73B that includes holder 48B and components associated with it in, respectively, an elevational view from the interior of station 46 looking toward the outside of station 46, a detailed view of a roller, a side elevational view, a top view, and an isometric view. In each of FIGS. 6A–9 holder 48 is in the operating position. Assembly 73B is installed in station 46, as are a corresponding assembly (not shown) for each of holders 48A and 48C that is identical to assembly 73B except for the different position of pivot 58A in holder 48A.

Receiving member 60B includes first and second spaced apart receiving arms 74 and 76 that define between them a receiving arm opening 78 to minimize contaminant particle entrapment. Receiving arms 74 and 76 are joined by a cross member 80 to constitute receiving member 60B; they are also joined by bottom member 62B, which together with receiving member 60B forms a mechanically unitary member 82. A pivot plate 83 attaches pivot 58B to receiving member 60B to provide maximum clearance for the placement of carriers 10 but may alternatively attach to bottom member 62B. Each of receiving arms 74 and 76 has respective one of first and second pairs 84 and 86 of opposing beveled edges 88 that form guides that receive guide members 28 and 30 of carriers 10. Each pair 84 and 86 defines between its beveled edges a respective one of first and second elongated slots 90 and 92 that minimize particle entrapment. Beveled edges 88 of each pair 84 and 86 are inclined toward the one of respective slots 90 and 92 defined by those edges.

Each of receiving arms 74 and 76 includes plural rollers 94 that are rotatably supported in each of slots 90 and 92.

Each of rollers 94 (FIG. 6B) has a surface 96 that includes two guide surface portions 98 and 100 and a bearing surface portion 102 separating them. Guide surface portions 98 and 100 are inclined toward bearing surface portion 102 and cooperate with one of guide members 28 and 30 to urge that guide member by gravity toward and onto bearing surface portion 102 in the predetermined alignment. Guide surface portions 98 and 100 and bearing surface portion 102 define an external surface formed of a polymer composition that neither retains contaminants nor generates particles by abrasion and therefore can be easily cleaned. To provide such a surface, each roller 94 is formed of black polypropylene. Slots 90 and 92 are open except where rollers 84 are located.

When receiving member 60B receives carriers 10 from the hand of a human being or from automated machinery, beveled edges. 88, slots 90 and 92, guide surface portions 98 and 100, and bearing surface portion 102 of each roller 94 cause carriers 10 to self-align by gravity, in the predetermined alignment, even if it is initially inserted in a somewhat misaligned orientation.

Bottom member 62B is provided with alignment pins 104 (FIGS. 7–8) that cooperate with recesses (not shown) formed in carriers 10 to locate carriers 10 in the predetermined alignment when it is loaded on receiving member 60B and/or supported on bottom member 62B. A sensing pin 106 (FIG. 8) cooperates with electronic components (not shown) to sense the presence of carriers 10 in holder 48B and to communicate that presence to the computer that controls holder assembly 64B.

Figure 10:
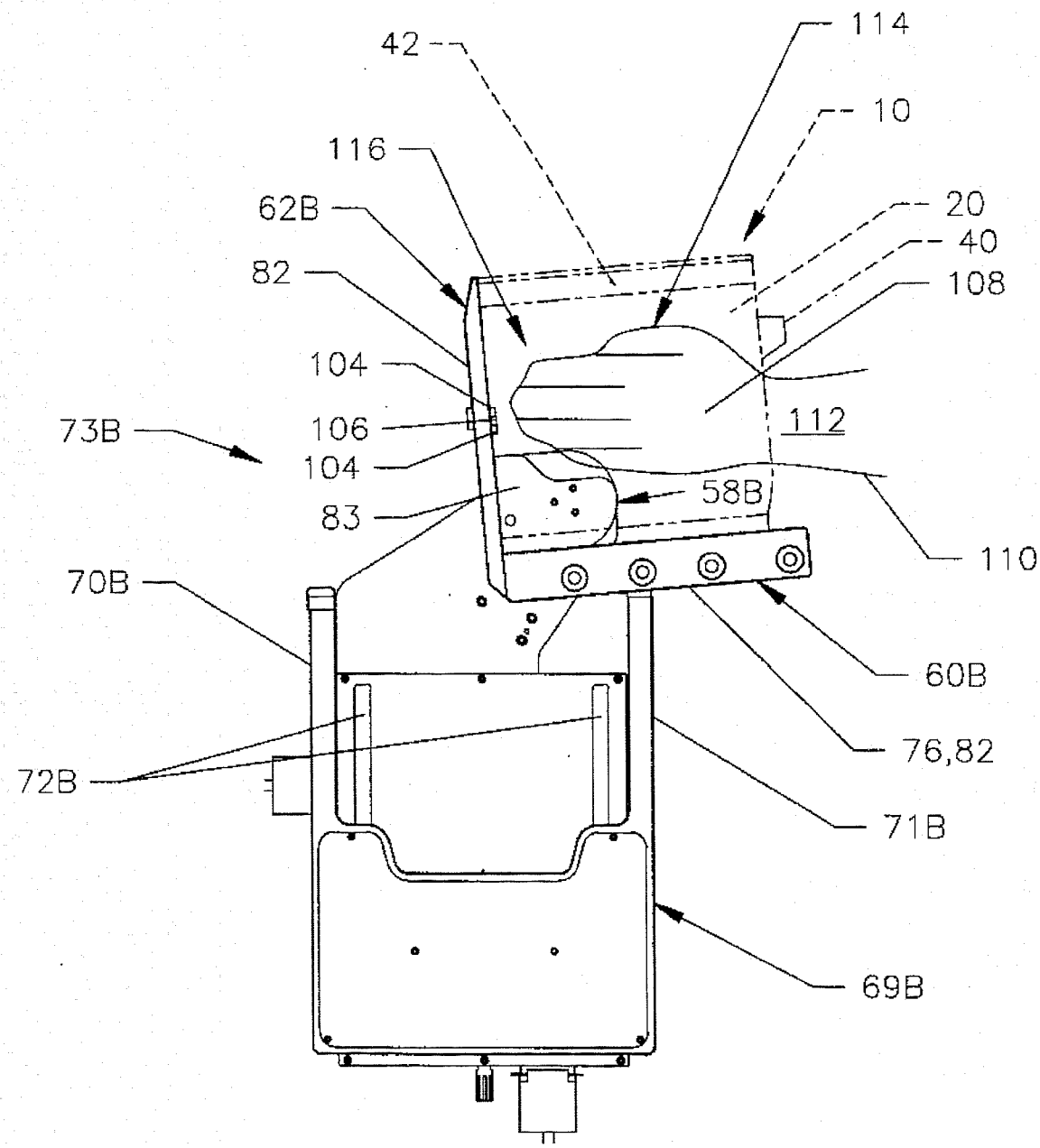
FIG. 10 is a side view of a carriers being manually loaded into, or removed from, the items shown in FIGS. 6A–9, with the holder in the load position.

FIG. 10 is a side elevational view of holder assembly 64B with holder 48B in the load position and of a carriers 10 in the process of being manually placed into, or removed from, holder 48B with hands 108 (only the left hand shown) of a human being 110. Hands 108 support carriers 10 by holding a respective one of sides 20 and 22 between them rather than by handle 40 and do so without substantial flexure of either of the human being's wrists 112. Thus, when holder 48B is in the load position, receiving member 60B receives carriers 10 from, or delivers it to, hands 108 for convenient manual insertion and removal of carriers 10 by'human being 110 without substantial flexure of either of wrists 112. Hands 108 can also support carriers 10 for manual placement into, or removal from, holder 48B by direct contact between any one or more of thumb 114 and fingers 116 of one of the left and right hands and a respective one of flanges 42 and 44, again without substantial flexure of either of wrists 112. When human being 110 supports carriers 10 in one of those ways, the risk of a repetitive stress injury to hands 108 and wrists 112 is greatly reduced.

Holder 48 is operated as follows. When holder 48 does not contain a carriers 10 and is to be loaded with a holder, it is tilted to the load position (FIG. 10). In the load position receiving member 60B is separated from the horizontal by an angular displacement of, e.g., about 5 degrees above the horizontal to promote loading and retention of carriers 10 in receiving member 60B. Human being 110 manually loads carriers 10 in holder 48 by placing guide members 28 and 30 in a respective one of slots 90 and 92, and carriers 10 self-aligns by gravity in holder 48 to the predetermined alignment, as described above. Alternatively, automated machinery (not shown) loads carriers 10 in holder 48 in the same way and with the same results. In the load position holder 48 orients front opening 24 of carriers 10 (FIGS. 1–3) generally upward and back opening 26 of carriers 10 generally downward; this seats wafers 12 by gravity in reproducible locations relative to carriers 10 (e.g., toward back 18 of carriers 10 to reproducible locations in the slots formed in carriers 10 to hold wafers 12).

Holder 48 and carriers 10 are then tilted to the hold position (not shown) in which wafers 12 are urged by gravity toward retention in carriers 10 and carriers 10 is urged by gravity to a reproducible location relative to receiving member 60B and bottom member 62B. Hold position is separated from the horizontal by an angular displacement of, e.g., about 2–3 degrees above the horizontal to avoid migration of wafers 12 out of carriers 10 because of, e.g., vibrations.

To further ensure reproducible location of wafers 12, holder 48 and carriers 10 are then tilted to about the load position so that wafers 12 are again urged by gravity toward the reproducible locations. The carriers is then tilted to one of the hold and operating positions. In the operating position carriers 10 is supported by base 16, specifically by support members 32 and 34 (FIGS. 2–3), with front opening 24 oriented for presentation of wafers 12 to transfer arm 52 (FIG. 4). In that position each of bottom member 62B, front opening 24 of carriers 10, and planar lower surface portions 27 of wafers 12 contained in carriers 10 is tilted at an angular displacement of about 0.5 degree relative to or down from the horizontal to enhance mechanical pickup of wafers 12 by transfer arm 52. Thus, the load and operating positions are separated by an angular displacement of about 95.5 degrees, and the hold and operating positions are separated by an angular displacement of about 2.5–3.5 degrees.

To remove carriers 10 from holder 48B, holder 48B is tilted to the load position, and carriers 10 is removed from receiving member 60B as described above, either manually or by automated machinery.

The invention includes features that make it desirable for use in applications that use automated machinery to load carriers 10 into, or to remove it from, holders 48. The relative insensitivity to holder initial misalignment upon loading permits a broader spatial tolerance for holder placement by machine loading equipment. A selective positioning of the pivot for, e.g., wall-mounted storage can provide flexibility in equipment arrangement. Finally, the vertical positioning of the wafers during loading and unloading provides the safest, cleanest, and most stable orientation to preserve the wafers because they are positioned edge downward in the carriers.

It will be apparent to skilled persons that many changes may be made to details of the specific embodiments of the invention described herein without departing from the underlying principles thereof. The scope of the invention should, therefore, be determined only by the following claims.

What is claimed is:

1. In an apparatus for performing an automated operation on a selected one of multiple specimens contained in a specimen carriers having a top, a base, and a back that includes two parallel guide members that extend straight from the top to the base of the specimen carriers, a tiltable carriers holder rotatable about a pivot between a load position and an operating position in which the apparatus can perform the operation on the selected specimen, comprising:

a receiving member that receives a specimen carrier and guides it to a predetermined orientation and a predetermined position, the receiving member having distal and proximal ends positioned respectively farther from and nearer to the pivot, and the receiving member extending generally horizontally outwardly from the pivot when the carriers holder is in the load position;

a bottom member rigidly attached to the proximal end of the receiving member and directed upwardly from the receiving member when the carriers holder is in the load position; and the receiving member including two directing elements for contacting and engaging the guide members of the specimen carrier when it is positioned in the receiving member in substantially the predetermined orientation, and the distal end of the receiving member being unobstructed so that a human being or a machine may readily place a specimen carrier into the predetermined orientation and predetermined position by placing the carrier near the distal end of the receiving member, engaging the guide members with the directing elements, and sliding the specimen carrier in a direction toward the proximal end of the receiving member until blocked by the bottom member.

2. The apparatus of claim 1, wherein the operation comprises automated insertion of a specimen into the carrier.

3. The tiltable carrier holder of claim 1, wherein each directing element supports plural rollers that cooperate with the guide members to guide the specimen carrier into the predetermined orientation and predetermined position.

4. The apparatus of claim 1, wherein the specimens include a layer of a semiconductor material.

5. The carrier holder of claim 1 in which the directing elements are designed to engage imperfectly oriented guide members and urge them into a correct orientation through the force of gravity.

6. The carrier holder of claim 1 in which each directing elements is comprised of an opposed pair of edges.

7. The carrier holder of claim 6 in which each opposed pair of edges is substantially open at the bottom to form a slot through which contaminates may fall.

8. The carrier holder of claim 1 in which the receiving member is tilted slightly upward from the proximal end to the distal end when the carrier holder is in the load position to facilitate the sliding of the specimen carrier to the bottom member.

9. In an apparatus for performing an automated operation on a selected one of multiple specimens contained in a specimen carrier having a back that includes two guide members and a base that includes a support member, a tiltable carrier holder selectively moveable between a load position and an operating position, comprising:

a receiving member that cooperates with the guide members to place and hold the carrier by gravity in a predetermined alignment relative to the receiving member when the receiving member is in the load position, the receiving member comprising a first and a second pair of opposing beveled edges, each pair defining between its beveled edges a respective one of first and second elongated slots through which contaminants may fall, the beveled edges of each pair inclined toward the slot defined by that pair, the beveled edges of the pairs and the slots defined by the pairs cooperating with a respective one of the guide members to cause the carrier to self-align in the predetermined alignment;

a bottom member that cooperates with the support member and the receiving member to secure the carrier in the predetermined alignment; and a pivot that is located to allow one of the receiving member and the bottom member to pivot between the load position and the operating position orienting the carrier so that the apparatus can perform the operation on the selected specimen.

10. The tiltable carrier holder of claim 9, further comprising first and second rollers supported in a respective one of the elongated slots and cooperating with the guide members to cause the carriers to self-align in the predetermined alignment.

11. The tiltable carrier holder of claim 9, further comprising plural rollers rotatably supported in each of the slots, each of the rollers having a surface that includes two guide surface portions and a bearing surface portion separating the guide portions, the guide surface portions of each roller inclined toward the bearing surface portion of that roller, the guide surface portions of each roller further of a character that cooperates with one of the guide members to urge that guide member toward the bearing surface portion of that roller so the guide member bears securely on the bearing surface portion in the predetermined alignment.

12. The apparatus of claim 11, wherein the rollers have an external surface formed of a polymer composition that is of a character that does not tend to retain contaminants.

* * * * *